United States Patent [19]
Reed et al.

[11] Patent Number: 5,574,984
[45] Date of Patent: Nov. 12, 1996

[54] METHOD AND APPARATUS FOR CONTROLLING A POWER LEVEL OF A BASE STATION OF A WIRELESS COMMUNICATION SYSTEM

[75] Inventors: John D. Reed, Arlington; Walter J. Rozanski, Jr., Hurst, both of Tex.

[73] Assignee: Motorola, Inc., Shaumburg, Ill.

[21] Appl. No.: 354,297

[22] Filed: Dec. 13, 1994

Related U.S. Application Data

[63] Continuation-in-part of Ser. No. 16,446, Feb. 11, 1993, abandoned.

[51] Int. Cl.$^6$ ........................................ H04B 7/00
[52] U.S. Cl. ..................... 455/69; 455/52.1; 455/56.1; 455/63; 455/67.1
[58] Field of Search ............................ 455/69, 70, 52.1, 455/52.3, 65, 54.1, 54.2, 67.1, 89, 83, 67.6, 67.4, 63, 127, 226.1, 226.2, 226.3

[56] References Cited

U.S. PATENT DOCUMENTS

| | | |
|---|---|---|
| 3,940,695 | 2/1976 | Sickles, II . |
| 4,228,538 | 10/1980 | Scharla-Nielsen et al. . |
| 4,580,262 | 4/1986 | Naylor et al. . |
| 4,777,653 | 10/1988 | Bonnerot et al. . |
| 4,901,307 | 2/1990 | Gilhousen et al. . |
| 5,003,619 | 3/1991 | Morris et al. .............................. 455/69 |
| 5,239,667 | 8/1993 | Kanai . |
| 5,245,629 | 9/1993 | Hall . |
| 5,386,589 | 1/1995 | Kanai ....................................... 455/69 |

OTHER PUBLICATIONS

Microwave Mobile Communications, Edited by William C. Jakes, Jr., A Wiley–Interscience Publication, 1974.

*Primary Examiner*—Andrew Faile
*Assistant Examiner*—Doris To
*Attorney, Agent, or Firm*—Richard A. Sonnentag

[57] ABSTRACT

After setting a base station to a transmit power level (12) which provides a signal at a subscriber unit having a target quality level, a fading characteristic of a communication channel between the subscriber unit and a base site is measured (13). The fading characteristic is then compared with a threshold value (14). The measuring (13) and comparing (14) are repeated until the fading characteristic crosses a threshold (15). Once the fading characteristic crosses the threshold for a receive Eb/No level that is representative of a e.g. static fading condition, the base transmit power that is transmitted to the subscriber is increased by a predetermined amount in anticipation of the need for an increased Eb/No for the case of a faded signal (61). The determination of the fading characteristic and threshold comparison may be performed at either the subscriber unit or the base station.

7 Claims, 4 Drawing Sheets

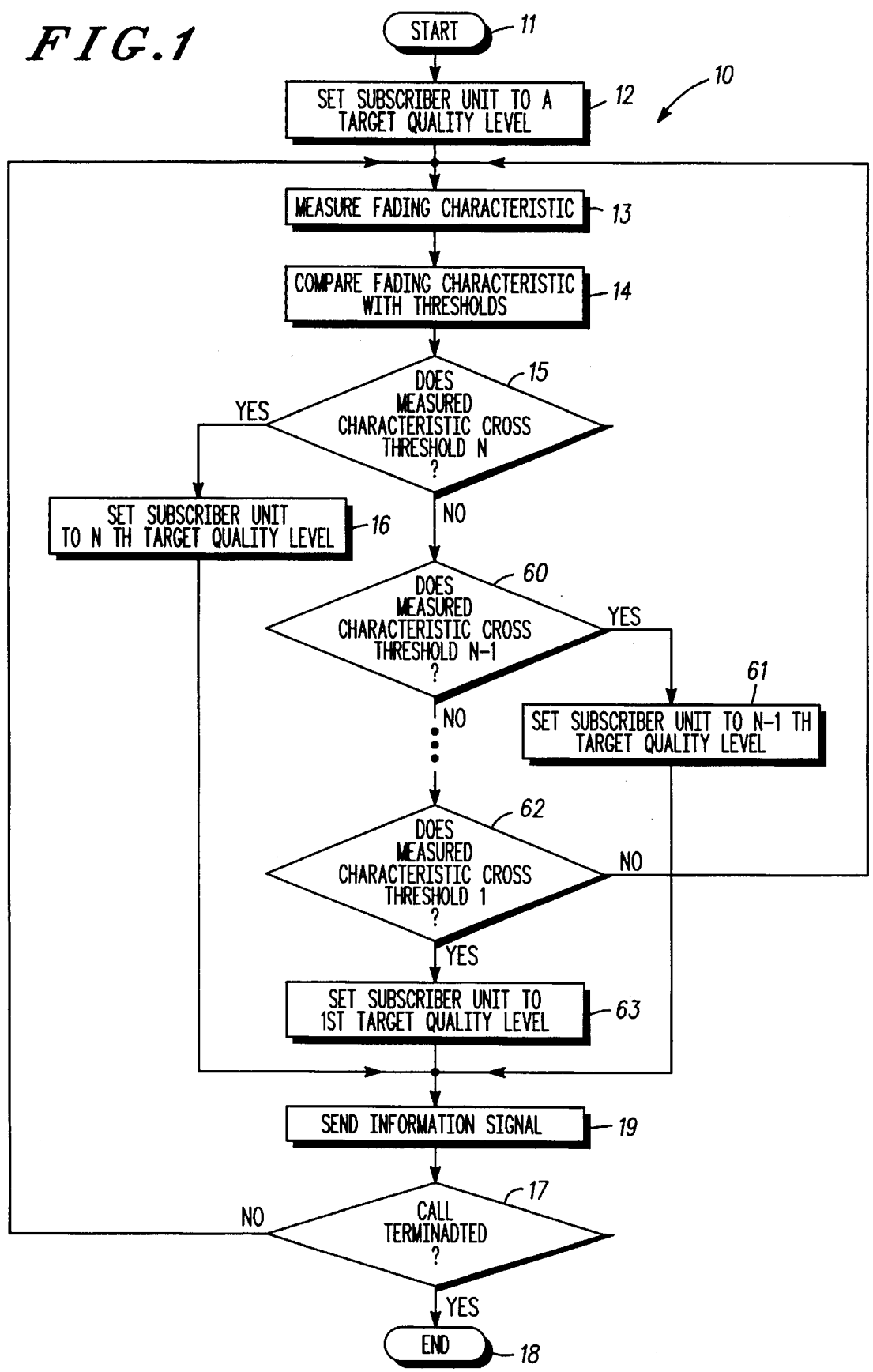

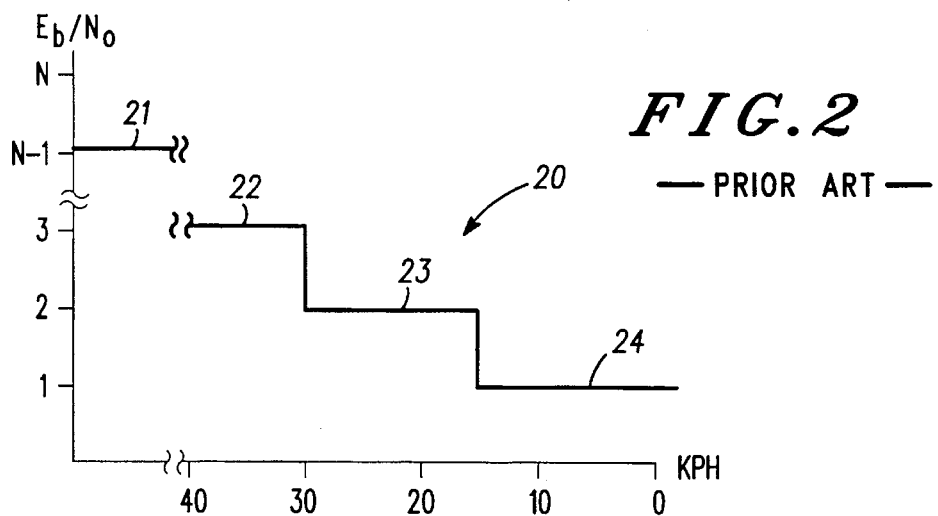
FIG.2 — PRIOR ART —
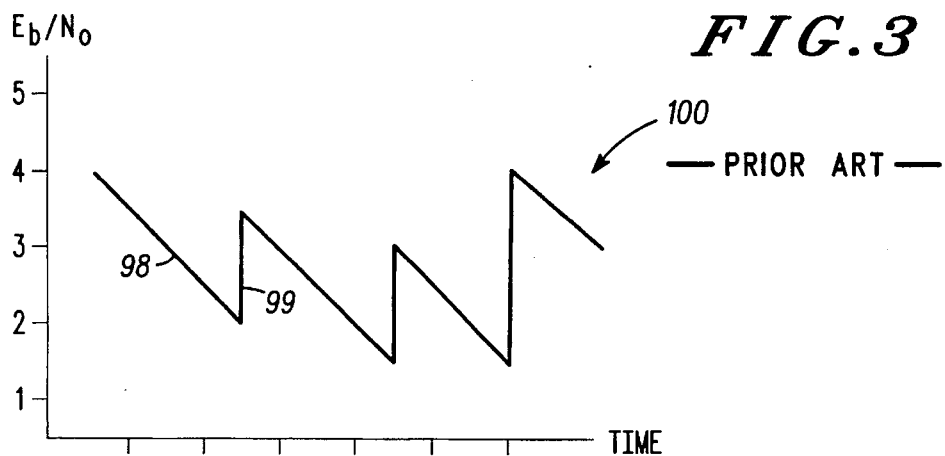
FIG.3 — PRIOR ART —
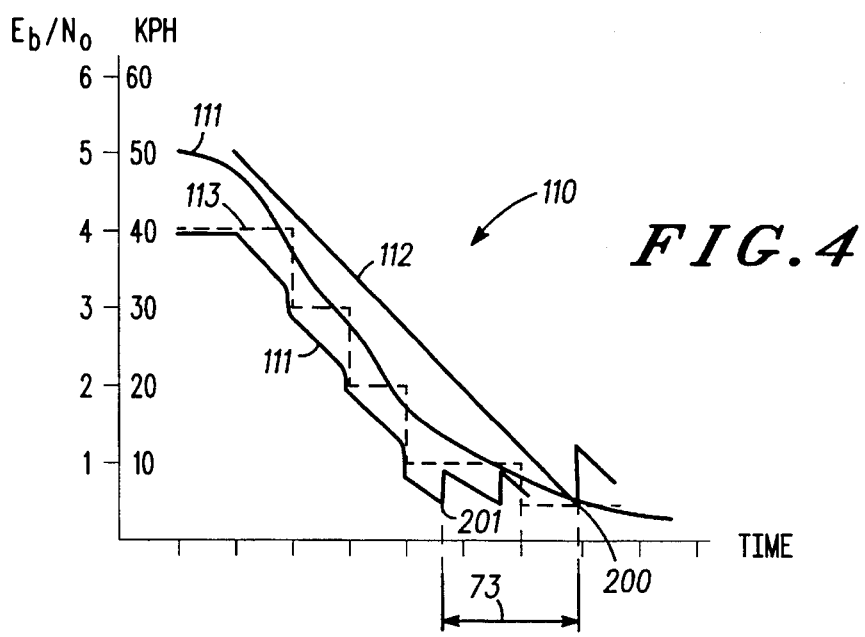
FIG.4

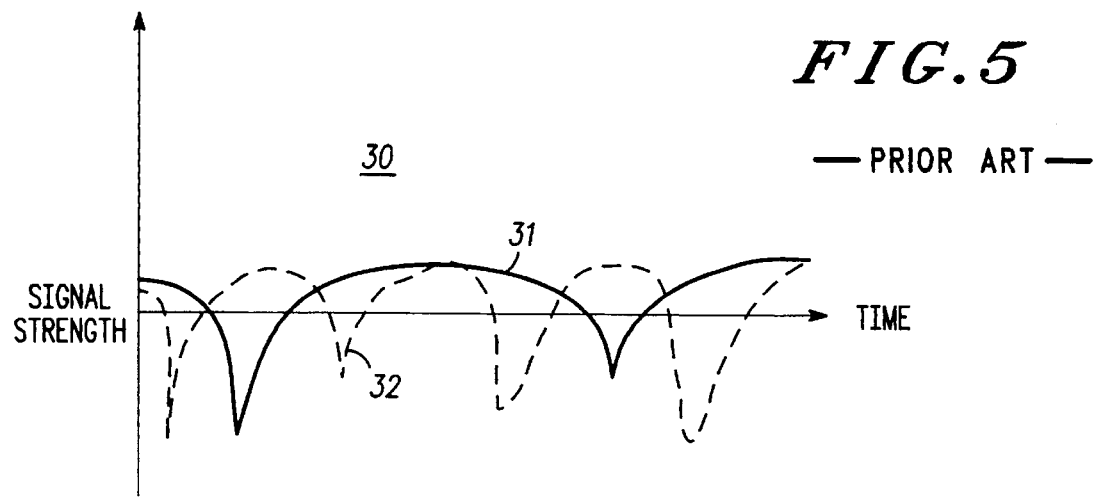
FIG.5 —PRIOR ART—
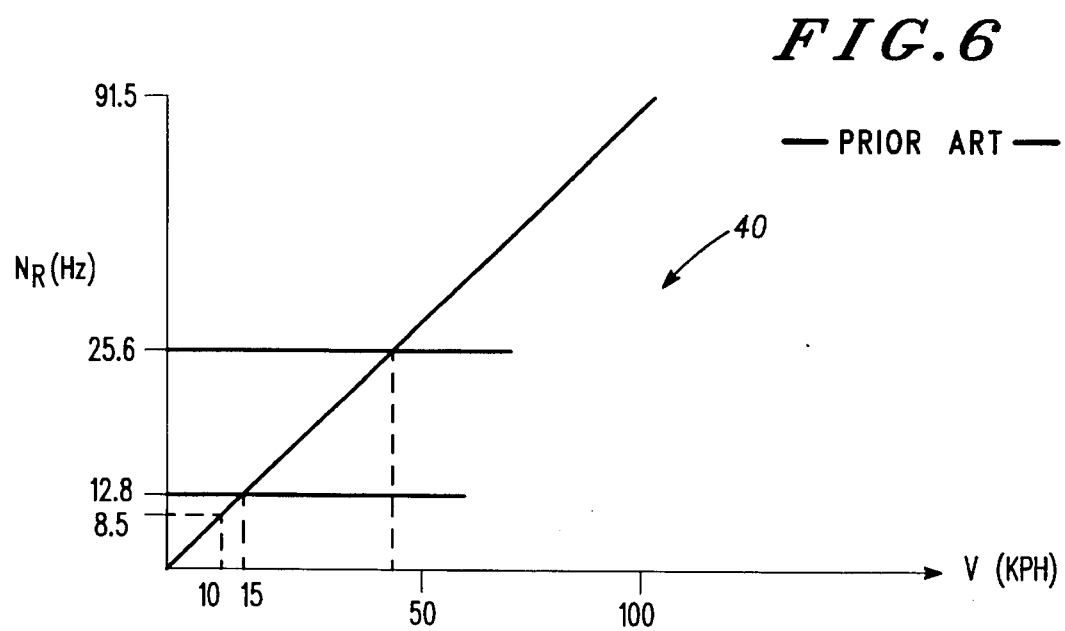
FIG.6 —PRIOR ART—
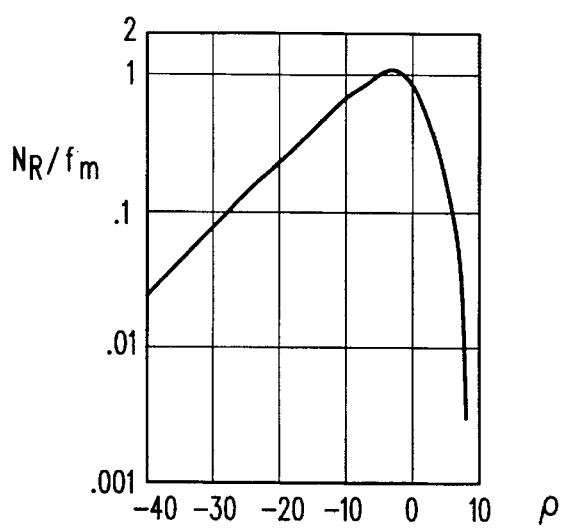
FIG.7 —PRIOR ART—

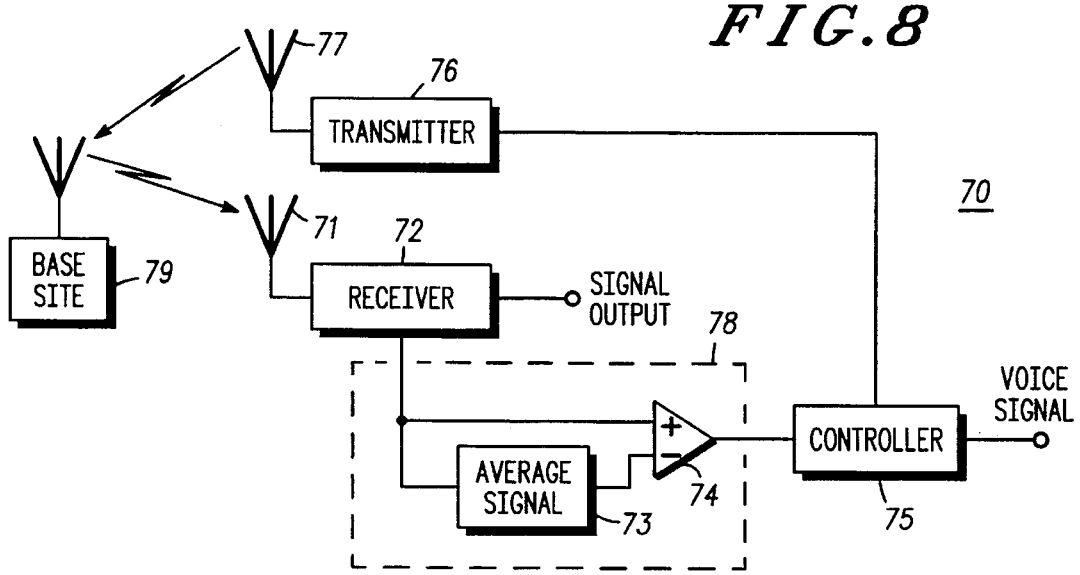
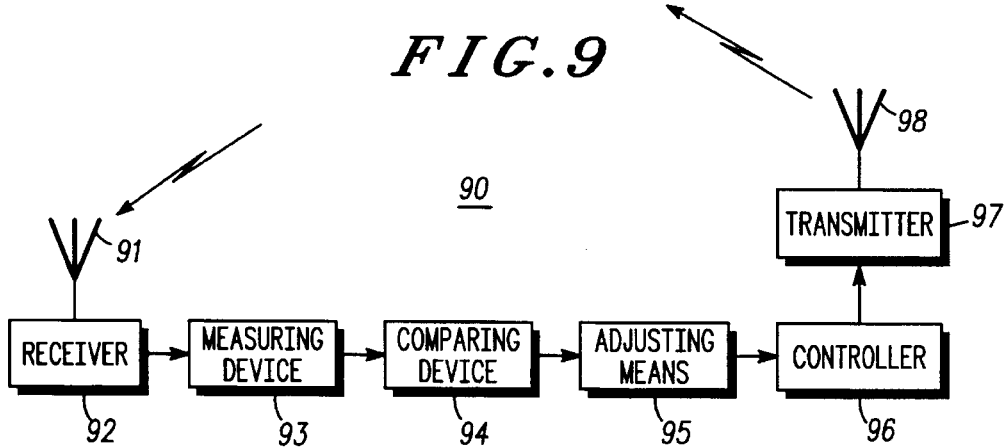

METHOD AND APPARATUS FOR CONTROLLING A POWER LEVEL OF A BASE STATION OF A WIRELESS COMMUNICATION SYSTEM

The present application is a continuation-in-part of application Ser. No. 08/016,446, filed Feb. 11, 1993 now abandoned. It is also related to the following applications, all owned by the assignee of the present application:

A Method for Compensating for Capacity Overload in a Spread Spectrum Communication System, Ser. No. 07/783,751, filed on Oct. 28, 1991.

FIELD OF THE INVENTION

The present invention relates, in general, to wireless communication systems and, more particularly, to a method and apparatus for controlling a power level of a base station of a wireless communication system.

BACKGROUND OF THE INVENTION

In wireless communication systems such as Code Division Multiple Access (CDMA) environments, it is desirable to maintain the energy used per bit as compared to the noise in a given bandwidth ($E_b/N_o$) at a level where the signal is received sufficiently well (e.g. has sufficient quality) at the subscriber unit. However, while raising the $E_b/N_o$ level would provide a high quality call (e.g. by causing the base station to increase its transmit power allocated to a subscriber), it would also reduce the system capacity since the signal ($E_b$) of one call within the bandwidth is, in general, interference ($N_o$) to other calls. The CDMA base transmission uses orthogonal codes assigned to each user to reduce the interference on the forward link by partially separating the signals of the different users to allow operation on the same frequency with a minimum of interference within the same cell, but interference from other cells does not benefit from this coding method and is added directly as noise power ($N_o$). Therefore, due to the interference concern, it is also desirable to keep the $E_b/N_o$ level as low as possible while still providing a suitable quality signal. A more detailed description of the power level/capacity trade-off is made in related application Ser. No. 07/783,751, which is incorporated herein by reference. Since a CDMA base station uses a single bandwidth for transmitting to multiple subscriber units, codes are used to separate the signals that are sent simultaneously to each subscriber unit. For this reason, the power that is sent to each subscriber can be allocated from a maximum base transmit power, to supply the needs of each subscriber. This allows a more efficient use of the power available at the base to support the power needs of all the subscribers in the cell. As subscribers need more or less power, the allocation to each subscriber can change within limits, such that there will be a minimum and maximum that can be supplied to each subscriber. This allocation process is well known in the art, and can be considered the same as having a fixed power control range with a minimum and maximum.

In order to accomplish the objective of giving each user the minimum amount of signal to satisfy the required quality level, present proposals use a power control loop to set the $E_b/N_o$ to a desired level based on the Word Error Rate (WER). When the subscriber is stopped, the $E_b/N_o$ at the subscribers receiver, is gradually reduced to a level that is lower by several decibel (dB) than when the subscriber is moving. A higher $E_b/N_o$ is necessary for a moving vehicle to maintain the WER in a propagation environment which is more hostile, i.e. is subject to Rayleigh fading of the signal due to the movement of the user through a large number of standing waves and reflections which produce large variations in the envelope and phase of the received signal. The WER is measured to determine power adjustments to be transmitted to the base station. These adjustments serve to maintain a nominal $E_b/N_o$ level. In practice, the base transmit power that is transmitted to a user is gradually reduced which results in a reduced $E_b/N_o$ and increased WER. Once the WER exceeds a certain limit, the subscriber sends a message to the base causing the base transmit power to be raised to a level where the WER at the subscriber unit is acceptable. The process then repeats. This process is referred to as a power control loop.

However, as the subscriber unit begins moving the WER will increase at a rate beyond which the low level $E_b/N_o$ can be maintained. Once the WER increases past a preset point (threshold), or accelerates at a given rate, the system will gradually increase the $E_b/N_o$ level (i.e. by increasing the base transmit power) to a higher level required at higher speeds.

There are many power control circuits and algorithms that are well known in the art. Almost all of these use an average signal value to determine the amount of power to send, this average being an estimate of the local mean of the signal at the receiver. The reason that the average is used rather than the instantaneous signal strength is that the bandwidth required to track the instantaneous signal would be prohibitive. Therefore, only slowly changing variations are tracked by the power control circuits, which require the receivers to be able to tolerate the fast variations of the Rayleigh fading, sometimes called fast fading. In the case of a static channel when there is no motion, the receiver operates at the lowest level of signal since it does not have to tolerate fast variations in the envelope. The power control tracks the slow changing variations, called shadow fading or Log Normal fading, by averaging out the fast fading variations to get a local mean estimate of the average signal at the receiver. The local mean estimate is generally obtained from averaging over at least 20 to 40 wavelengths of the signal so that a sufficient number of samples of the fading envelope are included in the average; alternatively a median of the samples can be used rather than an average, but the result is still a local mean estimate. Normally at least 20 samples are averaged to get a single local mean estimate which from the statistics of a Rayleigh fading envelope with uncorrelated samples would give an RMS error for the estimate of 1.0 dB compared to the true local mean.

With the Rayleigh fading averaged out, a sample of the average power can be used to set the power control. This is done now at a slow rate which is compatible with a limited bandwidth signal. The slow fading that is corrected for by the power control takes seconds to change significantly, and this is the type of fading that is compensated for by the prior art power control circuits.

A problem with the present situation as it applies to the CDMA radio system is the delay in shifting from one $E_b/N_o$ level to another as the modem requirements change caused by differing channel conditions. This type of delay can result in one of two related and undesirable events which occur when the subscriber changes speed or stops. A change in speed results in a change in the required $E_b/N_o$; which effects the quality of the channel due to the delays in the power control loop. The first event is that, from a signal perspective, the $E_b/N_o$ is now less than what is considered good for the system. This causes a poorer acceptable signal quality in the channel which directly effects the user signal. The other event is that, from a system perspective, the $E_b/N_o$ is now greater than what is required causing increased noise in the bandwidth for other subscribers. The former case in which the users signal is degraded is of concern since many bad frames will be received by the subscriber before the standard power control loop can adjust the signal level.

Therefore, it would be desirable to reduce the transition time for the user who is receiving bad frames due to power control loop delay to as short a time period as possible to avoid these signal outages and thus improve the overall quality of the users service.

SUMMARY OF THE INVENTION

A method of controlling a power level of a base unit of a wireless communication system having a target quality level is provided. The method may include, after first setting a target quality level for a subscriber unit, adjusting the power level of the base unit to generate a signal providing the target quality level when received at a subscriber unit. A fading characteristic of the communication channel between the subscriber unit and the base site is then measured and compared with a threshold value. The measuring and comparing are repeated until the fading characteristic crosses the threshold. When the Eb/No received at the subscriber unit is below a threshold value, indicative of a static environment, and once the fading characteristic crosses the threshold, additional power is requested from the base in anticipation to the need for a higher Eb/No in a fading environment.

An apparatus to accomplish the above method is provided by a subscriber unit having a receiver to receive an RF signal. The received signal is averaged in an averaging device and the average is compared with the original RF signal in a comparing device. The output data of the comparison is provided to a first control unit which uses the comparison information to provide an indication of the fading environment to determine if the user is in a static environment or is experiencing the occurrence of fades.

BRIEF DESCRIPTION OF THE DRAWINGS

FIG. 1 is a block diagram of a flow chart illustrating a process embodying the present invention;

FIG. 2 is a graph illustrating the effect of vehicle speeds on the required $E_b/N_o$ to obtain a target quality level of approximately 1% WER.

FIG. 3 is a power control graph illustrating the operation of a prior art method;

FIG. 4 is another power control graph providing a comparison of the present invention with the prior art;

FIG. 5 is a prior art graph representing a multipath fading characteristic and variation by speeds;

FIG. 6 is a prior art graph representing fading characteristic probabilities as a function of speed;

FIG. 7 is a prior art graph showing normalized level crossing rates; and

FIG. 8 is a block diagram of a power control portion of a subscriber unit designed to operate with the method of FIG. 1.

FIG. 9 is a block diagram of a power control portion of a base station designed to operate with the method of FIG. 1.

DETAILED DESCRIPTION OF THE DRAWINGS

Referring initially to FIG. 1, a block diagram of a flow chart illustrating a process, generally designated 10, embodying the present invention is shown. Process starts at block 11 when a call is established. Once established, 12, the base transmit power is directed to transmit a power level suitable to obtain a predetermined WER at the subscriber, representing a given quality level. This quality level represents a certain Eb/No for the channel conditions that exist at this time. A fading characteristic is then measured, 13. This information is compared in block 14 to a threshold value. If the fading value measured in block 13 is greater than the threshold, the level of the $E_b/N_o$ is tested in block 60. Otherwise, a test for call termination is made in block 17. If block 60 found that the Eb/No was above a minimum level, then an increase in the Eb/No is requested by directing the base to transmit more power (block 61). After the test in block 17, the loop repeats.

As shown in FIG. 2, a prior art graph, generally designated as 20, the speed of the subscriber can be seen to require different levels of Eb/No to maintain a given low WER or high quality level. Line 21 represents the Eb/No requirement for Rayleigh fading, and line 22 represents the Eb/No requirement for Multi-path fading which has delayed rays suitable for reception by the type of receiver used in a CDMA radio system. It is important to note that for speeds near zero, the required Eb/No is reduced dramatically. Also, for speeds approaching 5 to 15 KPH (depending on the fading), the required $E_b/N_o$ increases rapidly. At higher speeds, beyond the peak requirement, the needed Eb/No gradually decreases due to the effect of interleaving which improves the modem performance at higher speeds.

In FIG. 3, a prior art graph, generally designated 100, is depicted representing actual $E_b/N_o$ levels over time. As a vehicle's speed changes, assume that the WER rate improves permitting the transmit power to be reduced, resulting in a lower $E_b/N_o$. The $E_b/N_o$ level is gradually reduced (using a power control loop), line 98, over potentially several seconds until an unacceptable threshold word error rate (WER) is exceeded. The base is then given a command to raise its power level. The remote units reaction is represented by line 99. The level of the step increase can be set by the system operator as desired, and may typically be near 1 dB. These steps are repeated continuously as shown.

In FIG. 4, a composite graph, generally designated 110, is illustrated showing $E_b/N_o$ adjustments using the prior art and the present invention. When the speed of the remote unit, represented by line 111, changes, the prior art method results in the changes to $E_b/N_o$ received at the subscriber unit represented by line 25. As an example, a subscriber unit is shown to be traveling near 20 KPH at the beginning of the graph, and gradually slows down to zero KPH after about 4 seconds. During this time, the required Eb/No increases to maintain the desired quality level, and thus the power control loop causes the Eb/No to be increased as seen by line 25. Once the subscriber is stopped, the required Eb/No is reduced, and it falls to a minimum value near 4 dB until the subscriber again begins to move. At this time, the required Eb/No increases quickly, but before the power control can react to this need, it must detect a sufficient number of frame errors to indicate that the WER has increased, and then it must begin to increase the base station transmit power. This represents a time delay in which numerous frame errors are occurring, and which will be heard as a degradation in the audio of the subscriber unit. In the present invention, this delay time is reduced as indicated by 73, from the detection of the fading signal which indicates the need for increased Eb/No for the case when the Eb/No is low. This invention anticipates the need for the increased Eb/No and initiates the base to increase the power level causing the Eb/No to increase sooner 74, and thus reduce the effect of the time required to detect the frame errors and begin the adjustments as in the prior art.

A Rayleigh multipath fading characteristic is illustrated in FIG. 5, a prior art graph, generally designated 30. The dashed line 32 represents a stationary subscriber unit. As shown, even while stationary, the fading characteristics would seem to indicate some movement. From a practical implementation, a stationary subscriber can encounter nulls at a rate indicating movement on the order of 10 KPH in some traffic conditions, (e.g. from passing vehicles) but in other cases may see no fading nulls at all.

When the subscriber increases speed, the nulls will appear more frequently, as represented by solid line 31, or dashed line 33, FIG. 5. Therefore, the number of fades in a given period is generally representative of the speed of the subscriber. It is only the case in which there are little or no fading nulls on the channel that is representative of a static channel, which will operate at a very low Eb/No. It is this case in which the change in fading characteristics will be most easily detected, and also the case in which needs the rapid increase in Eb/No when the subscriber starts to see fading. It should be noted that a change in the fading characteristic could be caused by motion near the subscriber, without requiring the subscriber to move. This case would still work well with the invention since the detection of the fading envelope would still be possible, and the change in signal requirement by the subscriber could be detected as in the case when the subscriber begins to move.

Returning now to FIG. 1, once the fading characteristic is measured, it is compared to a threshold value. This is illustrated in the prior art graph of FIG. 6, generally designated 40, which shows a graph of the frequency ($N_R$) of fades as a function of velocity (V). The fades are measured in the number of level crossings per second (Hertz or Hz) and the velocity in KPH. The graph of FIG. 6 is derived using equation (1):

$$N_R = (f_m)(x) \quad (1)$$

where:

$f_m$ is the Doppler shift in Hz; and x is a constant which can be obtained from the graph of FIG. 7.

The graph of FIG. 7 is a prior art graph representing normalized level crossing rates. This graph is described in detail in Jakes, "Microwave Mobile Communications", pg 35 (1974). If it is assumed that, for p=1, any fade which crosses the average value will be counted as a fade then, using the graph of FIG. 7, the value of $N_R/f_m$ is 0.915. In order to determine $N_R$, $f_m$ must first be determined using equation (2):

$$f_m = (1.5)(V)(0.62)(F) \quad (2)$$

where:

V is the velocity in KPH;

F is the frequency in GigaHertz (GHz);

the constant 0.62 is used to convert velocity (V) in equation (2) from MPH to KPH; and the constant 1.5 represents several combined constants and scale factors. Using equation (2), the Doppler shift at 10 KPH for a 1 GHz signal is 9.3 Hz. Substituting this into equation (1) provides a crossing rate, NR, of 8.5 level crossings per second. At 15 KPH, the crossing rate is 12.8. At 30 KPH, the crossing rate is 25.6, thus a detection of the transition from a stationary user to a user that is moving could be made by testing this parameter. If the user was stationary, the level crossing rate would be at a small number if these were traffic nearby, and it would be zero if there were no traffic.

If the fading characteristic crosses threshold level (decision step 15) for the case when the Eb/No level is presently below a threshold value (decision step 60) then the subscriber will request from the base an increase in the signal to raise the Eb/No level in anticipation of the effects of the fading on the WER or quality level. Process 10 proceeds to determine if the call has been terminated, decision step 17. If the call has been terminated, process 10 ends, step 18. If the call is not terminated, then process 10 loops back to step 13.

In the prior art, the system would have continued to measure the WER while the base slowly decreased its transmit power. The $E_b/N_o$ of the subscriber unit, would be allowed to continue to decrease until a poor WER was detected. The power of the base unit is then increased until an acceptable WER was reached. Only after a sufficient number of Word Errors have been detected, such that the subscriber unit can determine that the WER has increased above a 1% WER or other predetermined WER quality level, can it make a request from the base for additional power which would raise its Eb/No value. During this delay time, the numerous frame errors will degrade the quality of the audio of the subscriber unit.

A block diagram of one embodiment of a power control portion of a subscriber unit, generally designated 70, is provided in FIG. 8. In FIG. 8, a signal is received from a base site 79 by antenna 71 and carried to receiver 72. Receiver 72 processes the signal and extracts the envelope of the signal which represents the instantaneous received power of the signal and supplies this to circuit block 78 to detect the threshold crossings of the received signal strength with an average signal strength.

Circuit 78 is comprised of a filter 73 for averaging the signal strength from receiver 72 (e.g. by determining a moving average over a time period, typically a few seconds); and a differential amplifier 74 to compare the averaged signal with the instantaneous value of the received signal. The output data from circuit 78 represents the zero crossings of the instantaneous received signal strength of the received signal to a short term average of the received signal power. This will then indicate the fading rate and this information is provided to a controller 75. The fading information is compared in controller 75 with a threshold level. When a threshold is crossed, and other decision criteria is met (decision 60) then controller 75 signals the base site by transmitter 75 through antenna 77. Alternatively, this fading information could be forwarded to the base site continuously as a part of the standard overhead message. The decision on whether a threshold has been exceeded could then be made the base site; or at the subscriber unit as before. It should be noted here that antenna 71 and 77 may be the same antenna if a duplexer is used in subscriber unit 70.

As an alternative to having the remote unit taking all of the measurements and making the various decisions, it should be understood that some of the measurements (e.g. Rayleigh fading) could be made at the base station based on the uplink channel (which should provide an approximation of the downlink channel fading characteristic). The base station would then direct adjustments to its transmit power when it detects a fading signal representative of a change in subscriber speed or environment. Information relating the subscriber's nominal Eb/No level could be used in this decision process. Conversely, actions currently performed by the base site could be made at the subscriber unit.

In particular, FIG. 9 depicts a block diagram of a power control portion of a base station designed to operate with the method of FIG. 1. In FIG. 9, the apparatus receives a signal at antenna 91 and directs said signal to the receiver 92. The receiver 92 filters out a useful signal envelope which is directed to a measuring device 93 which measures and calculates a fading characteristic for said signal. The measuring device 93 directs its output to a comparing device 94 which compares the fading characteristic against a threshold level. Based on the result of the comparison, the adjusting device 95 directs the controller 96 to adjust the output power of the transmitter 97 in an attempt to improve system performance.

Thus, it will be apparent to one skilled in the art that there has been provided in accordance with the invention, an improved method and apparatus for controlling a power level of a wireless communication system.

While the invention has been described in conjunction with specific embodiments thereof, one skilled in the art will appreciate that many alterations, modifications, and variations are possible and evident in light of the foregoing description. Accordingly, the invention is not limited thereby, but embraces all such alterations, modifications, and variations encompassed by the following claims.

We claim:

1. An apparatus for controlling a base station of a wireless communication system, the apparatus comprising:

receiving means for receiving a first radio frequency (RF) signal from the base station and determining a received signal strength of the first RF signal;

comparing means for comparing the averaged received signal strength with the received signal strength to determine a fading characteristic, and for further comparing the fading characteristic with a threshold value to determine when the fading characteristic crosses the threshold value; and control means for sending a power level adjustment signal to the base station when the fading characteristic crosses the threshold value.

2. A method of controlling a base station of a wireless communication system, the wireless communication system having an initial target quality level for a signal communicated between a subscriber unit and the base station, the method comprising the steps of:

(a) setting a power level at the base station to obtain the initial target quality level at the subscriber unit;

(b) measuring a frequency of fades at which a signal strength of the signal crosses an average of the signal strength;

(c) comparing the frequency of fades with a preset frequency of fades representing a threshold level;

(d) controlling the base station to reduce the power level when the frequency of fades crosses the preset frequency of fades representing the threshold level.

3. The method of claim 2 further comprising the step of reducing the power level of the base station if a word error rate (WER) does not exceed a threshold WER.

4. The method of claim 2 wherein the wireless communication system is a Code Division Multiple Access (CDMA) system.

5. An apparatus for controlling a base station of a wireless communication system, the apparatus comprising:

adjusting means for adjusting a power level of the base station to obtain a target quality level at a subscriber unit;

receiving means for receiving a first radio frequency (RF) signal via the communication channel and determining a received signal strength of the received RF signal;

averaging means for averaging a period of time of the received signal strength and providing an averaged received signal strength;

comparing means for comparing the averaged received signal strength with the received signal strength to determine a fading characteristic, and for further comparing the fading characteristic with a threshold value to determine when the fading characteristic crosses the threshold value; and control means for further adjusting the power level of the base station when a fading characteristic of a communication channel between the subscriber unit and the base station crosses the threshold value.

6. The apparatus of claim 5 further comprising receiver means for receiving a power adjustment signal from the subscriber unit when the fading characteristic crosses the threshold value, wherein the control means is operable for further adjusting the base station power level based on the power adjustment signal.

7. The apparatus of claim 5, wherein the receiving, the averaging and the comparing means reside in either the base station or the subscriber unit.

* * * * *